United States Patent
Gwinn

(10) Patent No.: US 8,134,385 B2
(45) Date of Patent: Mar. 13, 2012

(54) SPLIT CASCODE LINE AMPLIFIER FOR CURRENT-MODE SIGNAL TRANSMISSION

(76) Inventor: Joseph Gwinn, Wellesley, MA (US)

( * ) Notice: Subject to any disclaimer, the term of this patent is extended or adjusted under 35 U.S.C. 154(b) by 2153 days.

(21) Appl. No.: 10/753,165

(22) Filed: Jan. 6, 2004

(65) Prior Publication Data
US 2005/0146389 A1  Jul. 7, 2005

(51) Int. Cl.
*H03K 17/16* (2006.01)
(52) U.S. Cl. .......................................... 326/30
(58) Field of Classification Search ............ 381/77, 381/28, 56, 79–85, 120, 121; 333/332, 124; 375/259; 330/311, 98, 99, 100; 326/30; 327/100
See application file for complete search history.

(56) References Cited

U.S. PATENT DOCUMENTS

| | | | |
|---|---|---|---|
| 2,964,589 A | 12/1960 | Walker | |
| 3,333,199 A | 7/1967 | Janssen | |
| 3,413,563 A | 11/1968 | Tongue | |
| 3,458,665 A | 7/1969 | Markey | |
| 3,516,003 A | 6/1970 | Boone | |
| 3,660,772 A | 5/1972 | Holt | |
| 3,718,762 A | 2/1973 | Nezu et al. | |
| 3,723,761 A | 3/1973 | Masaki | |
| 4,020,450 A * | 4/1977 | Kostrukoff | 367/21 |
| 4,066,993 A * | 1/1978 | Savit | 367/77 |
| 5,337,011 A * | 8/1994 | French et al. | 330/258 |
| 5,504,782 A | 4/1996 | Campbell, Jr. | |
| 5,535,241 A | 7/1996 | Mahant-Shetti et al. | |
| 6,563,342 B1 * | 5/2003 | Fulkerson | 326/73 |
| 6,597,229 B1 * | 7/2003 | Koyata et al. | 327/333 |

* cited by examiner

*Primary Examiner* — Shawki S Ismail
*Assistant Examiner* — Thienvu Tran
(74) *Attorney, Agent, or Firm* — Leason Ellis LLP

(57) ABSTRACT

Current-mode transmission is implemented in a cascode amplifier by splitting a cascode circuit into a front end and a back end to ensure wideband current-mode transmission of an audio signal. A transmission cable is located between the high impedance output of the first end and the low impedance input of the back end. The front end includes a first amplifying device, and the back end includes a second amplifying device. The front end is phantom powered by the back end using the same electrical conductors that carry the current-mode signal over the transmission cable.

19 Claims, 2 Drawing Sheets

SPLIT CASCODE LINE AMPLIFIER FOR CURRENT-MODE SIGNAL TRANSMISSION

BACKGROUND OF THE INVENTION

1. Field of the Invention

The present invention generally relates to the high-fidelity transmission of analog signals over electrical transmission cables and, more particularly, to a split cascode line amplifier for current-mode signal transmission.

2. Description of the Related Art

A considerable disadvantage and limitation of electrical transmission cables used to carry analog signals is the self capacitance of such cables. Here, signals carried by these cables tend to be attenuated and distorted to a degree that is determined by the impedances of the source and sink, as well as the length of the cable. In this case, signals at higher frequencies and signals sent over longer cables suffer a greater level of degradation.

Another disadvantage and limitation associated with transmission cables is that some types of insulation used in the manufacture of such transmission cables have dielectric and absorption constants that vary significantly with frequency, especially at low frequencies. This causes disturbing distortions that are difficult to eliminate by equalization or the adjustment of tone controls. Such distortions of signals at low frequencies are particularly caused by dielectric absorption, i.e., soakage. This is in addition to the previously mentioned signal attenuation and distortion of the signal at high frequencies.

Yet another disadvantage associated with transmission cables is capacitive loading of the signal source by the cable. In the case of electromagnetic pickups, such as those used on steel-stringed musical instruments, this capacitive loading reduces the resonant frequency of the electromagnetic pickups.

With sufficient cable length and thus capacitance, the resonant frequency shifts into the mid-band (e.g., 3 to 5 KHz). This shift causes an overemphasis of the higher harmonics which leads to a harsh sounding instrument. In the case of piezoelectric transducers, cable capacitance reduces both the signal amplitude and bandwidth, but does not cause resonance to occur.

It is known in the prior art to diminish the above disadvantages by choosing cables which have a relatively low capacitance per meter and are made of insulating material having relatively low dielectric absorption. However, the improvement, although significant, is not sufficient to eliminate the above mentioned problems. As a result, the length of such cables is greatly limited.

Another prior art approach for minimizing the foregoing disadvantages is to provide voltage amplification and/or ensure that the signal source has a low output impedance. This permits the effect of cable capacitance to be greatly reduced. This is achieved at the expense of increased complexity and manufacturing costs. Also, voltage amplification does not solve the effects of distortion caused by dielectric absorption.

Another disadvantage associated with using electrical transmission cables to carry analog signals is that some transmission cables are themselves microphonic; that is, they respond like microphones and pick up extraneous sounds. This results in annoying noises that occur when the cables are handled or disturbed. This is a particular problem during public performances, where it is difficult to avoid disturbing the cables. Microphonics are especially significant in coaxial cables that are used in conjunction with high-impedance sources.

In coaxial cables, microphonics are primarily due to the triboelectric effect. This is caused by the cable shield rubbing against the outer surface of the cable insulation that is located between the center conductor and the shield of the cable. In conventional systems, triboelectric effects are reduced by the use of a special cable design. In this case, a resistive layer is interposed between the outer surface of the cable insulation and the inner surface of the shield. As a result, any triboelectric charge which is generated by handling or disturbing the cable is harmlessly drained off.

Cascode amplifiers are well known and are widely used as wideband or high-frequency amplifiers, having originally been developed in the late 1930s for amplification of radio frequency signals using vacuum tubes. This traditional circuit has subsequently been adapted to use field effect and bipolar transistors.

The use of one set of conductors to carry both electrical power and signals, i.e., phantom power, is also well known and widely practiced. This dates back to the telegraph and the early days of the telephone, circa 1900.

One characteristic of cascode circuits is their use of two three-terminal amplifying devices in cascade, where a high-impedance output of a first amplifying device feeds a low-impedance input of a second amplifying device. Here, the intent is to maintain wideband performance by eliminating the Miller Effect in both amplifying devices.

All practical amplifying devices have undesired parasitic capacitances between their terminals. In an inverting voltage amplifier, such as a junction field effect transistor (JFET) used in a grounded-source configuration, a small voltage change at the gate causes a much larger and opposite voltage change at the drain. Here, the ratio of the two changes is the voltage gain of the amplifier utilizing the JFET. A reasonable magnitude of voltage gain would be at least 10. As a result, if the input voltage to the JFET changes by +0.1 volts, the resultant output change would be −1.0 volts. Here, an inverting gain is signified by the minus sign. This implies that a current flowing from the gate to the drain via the parasitic capacitance is increased by the voltage gain. As a result, if the parasitic capacitance is typically 5 picofarads, the effective capacitance is in the order of ten times larger, or 50 picofarads. This increase in effective capacitance is called the Miller Effect, and it causes the bandwidth of the amplifier to be reduced sharply. In this case, the reduction of the bandwidth is by a factor of ten.

If the above inverting amplifier is the first (i.e., common-source) amplifying device of a cascode, the very low input impedance of the second (i.e., common-base) amplifying device renders the voltage gain of the first device negligible. As a result, the Miller Effect is prevented from occurring, and the bandwidth of the first stage of the overall cascode amplifier is preserved.

In the second device, the transistor base is grounded. As a result, the voltage variation that is observed on the collector of the transistor has no effect on the current that is supplied by the first device to the second device. Hence, the Miller Effect is also prevented from occurring in the second device. This double elimination of the Miller Effect permits a cascode amplifier to have a wide bandwidth.

While current-mode transmission is not currently used in the vast majority of audio or digital data transmission systems, current-mode transmission is well known and widely used in the field of industrial instrumentation in the form of sensors having "4-20 milliamp" interfaces. Here, the sensors are powered by a constant voltage source, and can be used to indicate temperature by varying the current drawn from 4 milliamps (i.e., a minimum temperature) to 20 milliamps (i.e., a maximum temperature). The large physical size, high power, and low bandwidth of sensors with 4-20 milliamp interfaces precludes their use in carrying high fidelity, low-level audio, or data transmission signals through electrical cables. Accordingly, there is a need for a way to implement current-mode transmission that is suitable for use in audio and data transmission systems.

SUMMARY OF THE INVENTION

The present invention relates to a split cascode line amplifier for current-mode signal transmission over a transmission line that has at least two conductors. In accordance with the invention, the split cascode line amplifier permits the use of cables for transmitting analog signals that are chosen based on their relatively low cost and high physical strength. This relieves the necessity to sacrifice the benefits associated with low cost and strength due to the need to choose cables based on their ability to achieve low source loading, transmit high fidelity signals, and eliminate microphonics.

A key observation has been made that a cascode circuit uses current-mode transmission to carry signals between its first and second amplifying devices. In addition, a cascode circuit can be split into front and back ends that are connected by a cable to take advantage of this observed property. This is possible all while retaining a wide operational bandwidth for which cascode circuits are valued.

In accordance with the present invention, current-mode transmission is implemented in the split cascode line amplifier in a manner that is a simple and suitable for use in audio systems. Here, the front end includes a first amplifying device, and the back end includes a second amplifying device. In addition, phantom power is implemented, where the back end energizes the front end via the transmission cable. The split cascode line amplifier of the contemplated embodiments permits the implementation of phantom power using the same components that are used to implement current-mode transmission over a cable.

The split cascode line amplifier of the contemplated embodiments is simple in structure and uses standard electronic components and thus, it is inexpensive to manufacture. The simplicity and low power nature of the front end circuitry also permits it to be powered from the back end via the transmission cable. As a result, a power source, e.g., a battery, is not required in the front end. The simplicity and absence of a battery in the front end permits the split cascode amplifier to fit entirely within the back shell of an ordinary cable connector. This facilitates the use of standard "off-the-shelf" cable connectors. In addition, the front end assembly can be "potted" for enhanced environmental and mechanical resistance, and the signal source does not to be modified. As a result, the cascode circuit of the present invention may be used with a wide variety of signal sources.

BRIEF DESCRIPTION OF THE DRAWINGS

The foregoing and other advantages and features of the invention will become more apparent from the detailed description of the exemplary embodiments of the invention given below with reference to the accompanying drawings in which.

DETAILED DESCRIPTION OF THE EXEMPLARY EMBODIMENTS

Figure 1:
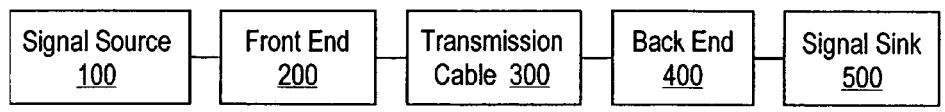
FIG. 1 is an exemplary block diagram of a split cascode line amplifier in accordance with the present invention.

FIG. 1 is an exemplary schematic block diagram of a split-cascode line amplifier 10 in accordance with the invention. As shown in FIG. 1, a signal originates in the signal source 100. The signal is supplied to the front end 200 and flows through the transmission cable 300 and the back end 400, and terminates in the signal sink 500.

In the contemplated embodiments of the invention, any source of signals can be used as the signal source. In certain embodiments, the signal source is a transducer. In the preferred embodiment, the signal source 100 is a microphone, an electromagnetic or piezoelectric transducer on a musical instrument, an accelerometer, a low-frequency radio antenna, a hydrophone, a geophone, or the like.

In conventional systems, the front end 200 can be a voltage amplifier, a transformer, or both, or it can be omitted. In this case, the signal source 100 is connected directly to the transmission cable 300. In accordance with the exemplary embodiments of present invention, the front end 200 is a voltage-to-current converter that is implemented using any of a number of known active devices. In certain embodiments, the active devices comprise field effect or bipolar transistors, vacuum tubes, or the like. In alternative embodiments, the active devices comprise integrated circuits, such as operational amplifiers.

In accordance with the exemplary embodiments of the invention, the transmission cable 300 is an electrical cable having at least two conductors. In the preferred embodiment, the transmission cable is coaxial cable, twisted pair (shielded or unshielded), star-quad cable (shielded or unshielded), zip-cord, or the like.

In conventional systems, the back end 400 is a transformer which can be omitted, where the transmission cable 300 is connected directly to the signal sink 500. In the exemplary embodiments of the present invention, however, the back end 400 is a current-to-voltage converter that is implemented using any of a number of active devices. In certain embodiments, the active devices comprise field effect or bipolar transistors, vacuum tubes, or the like. In alternative embodiments, the active devices comprise integrated circuits, such as operational amplifiers. In accordance with the exemplary embodiments, the signal sink 500 is typically an amplifier, a recording device, a digitizer, or the like.

With additional reference to FIG. 1, current-mode transmission is implemented by the voltage-to-current converter in the front end 200 operating in unison with the current-to-voltage converter in the back end 400. A varying voltage waveform applied to the input of the front end 200 is propagated as a substantially constant voltage but varying current over the transmission cable 300. The varying current is converted back to a varying voltage by the back end 400, and supplied to the signal sink 500 as a varying voltage waveform that replicates the shape of the original waveform applied to the input of the front end 200.

Because the transmission cable 300 receives a substantially constant voltage, the deleterious effects of self-capacitance of the cable and dielectric absorption in the cable insulation are substantially reduced or eliminated. Cable self-inductance is far less of a problem because the magnetic fields of adjacent conductors, which carry equal currents in opposite directions, substantially cancel each other. As a result, the effective inductance is sharply reduced. Simultaneously, there is no corresponding passive effect to cancel the self-capacitance effects of the cable. Current-loop transmission systems are similar to current-mode transmission systems. The difference between the two is that in current-loop systems, the conductors are too far apart for a significant cancellation of inductance to occur.

A key characteristic of current-mode transmission is that the output impedance of the front end 200 is a numerical "factor" higher than the input impedance of the back end 400. When the numerical factor is increased, the reduction in the deleterious effects of self capacitance of the cable and dielectric absorption in the cable insulation is also increased. Preferably, a factor of at least five is desired, and in practice far larger factors are easily achieved.

In accordance with the contemplated embodiments of the invention, triboelectric potentials (and thus cable microphonics) generated in the transmission cable 300 are suppressed by the combination of the power gain of the front end 200 and the shorting of cable capacitance by the low input impedance of the back end 400. Typically, the characteristic impedance of the transmission cable 300 is approximately the same order of magnitude as the input impedance of the back end 400, both of which are greatly exceeded by the output impedance of the front end 200. In addition, the transmission cable 300 is electrically short (e.g., less than a quarter-wave) at the frequencies of interest. As a result, the characteristic impedance of the transmission cable 300 has little effect on current-mode transmission.

Figure 2:
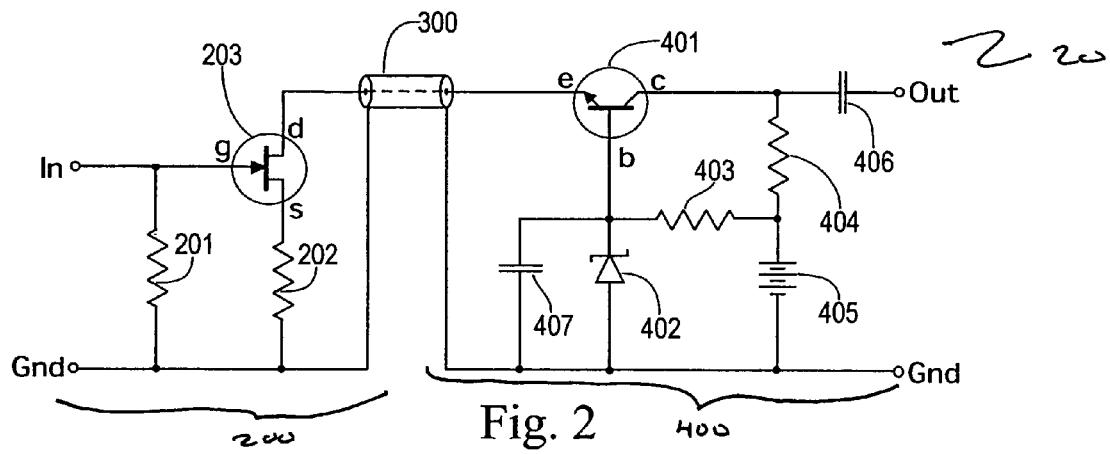
FIG. 2 is a schematic diagram of a split cascode line amplifier in accordance with the preferred embodiment of the present invention.

FIG. 2 is a schematic diagram of the split cascode line amplifier 20 in accordance with a preferred embodiment of the invention. With reference to FIG. 2, the front end 200 includes a junction field effect transistor (JFET) 203, a gate resistor 201, and a source resistor 202. JFETs inherently perform voltage-to-current conversion in this circuit configuration (common-source, inverting amplifier) and typically have output (drain) impedances in the megohms. Hence, the JFET 203 performs desired voltage-to-current conversions. As is well known in the art, gate resistor 201 and source resistor 202 operate in unison to set the operating point of the JFET, and the unbypassed source resistor 202 provides a substantial level of negative feedback. This is used to stabilize the drain current operating point due to variations in operating parameters of the JFET, such as those due to temperature and drain voltage. Typical component values are 2N5457 for JFET 203, 1 megohm for gate resistor 201, and 330 ohms for source resistor 202.

In accordance with the preferred embodiment, the transmission cable 300 comprises a length of commodity coaxial cable, such as RG-58 or RG-59. These types of cables are widely available, cheap, rugged, and are easy to handle. The present inventor has directly tested lengths of RG-59 up to 330 meters. The measured bandwidth of the tested embodiment was 200 kilohertz, which is limited by only transmission-line effects in the cable. In actual use, the length of the cable can be much greater, depending almost entirely on the highest frequency to be carried by the cable.

Back end 400 includes a bipolar transistor 401, a zener diode 402 (or equivalent), a bias resistor 403, a collector resistor 404, an output capacitor 406 and a bypass capacitor 407, all of which are powered by a power source 405, such as a battery. Bipolar transistors inherently perform current-to-voltage conversion in the circuit configuration of the present embodiment (e.g., common-base, non-inverting amplifier) and have input (e.g., emitter) impedances in the tens of ohms. As a result, the bipolar transistor 401, together with the collector resistor 404, performs the desired current-to-voltage conversion. Zener diode 402 and bias resistor 403 operate in unison to set the base voltage of transistor 401. As a result, the transistor 401 functions similarly to a regulated power supply and energizes the front end 200 via the transmission cable 300. The recovered varying voltage that appears on the collector of the transistor 401 is supplied to the signal sink 500 via the coupling capacitor 406. In accordance with the preferred embodiment, the base voltage of the transistor 401 is set to approximately 3.6 volts, and the emitter is regulated to about 3 volts. In addition, bipolar transistor 401 is typically a 2N3904 transistor, zener diode 402 is a LM385 regulator diode, resistor 403 is 10 kilohms, collector resistor 404 is 1.8 kilohms, coupling capacitor 406 and bypass capacitor 407 are 4.7 microfarads, and power supply 405 operates in a range of approximately 7 to 30 volts.

It is readily understood by a person skilled in the art that there are many ways to achieve a substantially constant voltage at the base of transistor 401, which is needed for cascode operation. In the preferred embodiment, this is achieved using zener diode 402. Zener diode 402 is often omitted. It is also readily understood by a person skilled in the art that the base of transistor 401 may need to be bypassed to ground using optional bypass capacitor 407. The biasing of cascode amplifiers is a well understood by a person skilled in the art.

It is further understood by those skilled in the art that the voltage-to-current conversion gain of the circuit of the preferred embodiment may be increased by use of a capacitor (not shown) to bypass source resistor 202, either partially or completely. In addition, it is understood by those skilled in the art that while the contemplated embodiments of the split cascode circuit may be used to transmit analog waveforms, digital data may also be transmitted based on the teachings contained herein. It is also understood by those skilled in the art that additional components may be readily added to adjust the input and output voltage ranges to match the properties of the signal source 100 and the signal sink 500, and to protect against electrostatic discharge (ESD) damage.

With further reference to FIGS. 1 and 2, when signal source 100 is not emitting a signal, the input of the front end 200 is in effect grounded. As a result, all voltages and currents are constant, and the resulting operating points are as follows: The base of bipolar transistor 401 is held by the zener diode 402 at a fixed voltage, such as 3.6 volts. Hence, the emitter of transistor 401 is maintained at a fixed voltage of approximately 3.0 volts, e.g. one diode drop lower. When JFET 203 is biased by resistors 201 and 202, it will draw a drain current of about 1.7 milliamps (mA) from the emitter of transistor 401 via the transmission cable 300. This current, which is nominally 1.7 mA, will pass through the collector resistor 404 and cause a voltage drop of (1.7 mA)×(1.8 kohms)=3.06 volts, as measured from the power supply voltage. In accordance with preferred embodiment, the power supply voltage is approximately 7-30 volts.

When a signal is being emitted from signal source 100, as this signal varies around ground, the various voltages and currents will vary around their operating points in response. If the input voltage is positive, the drain current will be reduced. On the other hand, if the input voltage is negative, the drain current and the voltage drop across the collector resistor 404 will be increased. As a result, a positive voltage excursion at the input to the front end 200 results in a negative voltage excursion of roughly the same amplitude at the output of the back end 400, having been carried as a current excursion in transmission cable 300.

The input impedance of back end 400 is equal to the impedance at the emitter of transistor 401. In accordance with the preferred embodiment, this impedance is approximately 20 ohms. On the other hand, the output impedance of the front end 200 is equal to the drain impedance of the JFET 203. Typically, this impedance value is in the order of megohms. For example, in cases where the output impedance of the front end 200 is 2 megohms, the theoretical impedance ratio is (2,000,000/20)=100,000. As a result, the desired voltage variation that is observed on the wire from the drain of JFET 203 to the emitter of transistor 401 will be very slight. In this case, if a 1 kilohertz signal having an amplitude of 730 milli-volts RMS is applied to the gate of JFET 203, then a voltage variation at the emitter of transistor 401 of 6.35 milli-volts RMS is achieved. This results in a voltage "gain" of 6.35/730=0.0087, or 20 log10(0.0087)=−41 dB. This is sufficient to render the effects of cable capacitance and cable dielectric quality totally irrelevant. Here, the measured bandwidth is about 200 kilohertz over a 330 meter length of coaxial cable. This bandwidth is limited only by transmission-line effects. In the case where a cable having a length of 10 centimeters is used, a measured bandwidth of about 10 megahertz is achieved, despite the use of low-cost commodity components. This wide bandwidth is a characteristic of cascode circuits.

Figure 3:
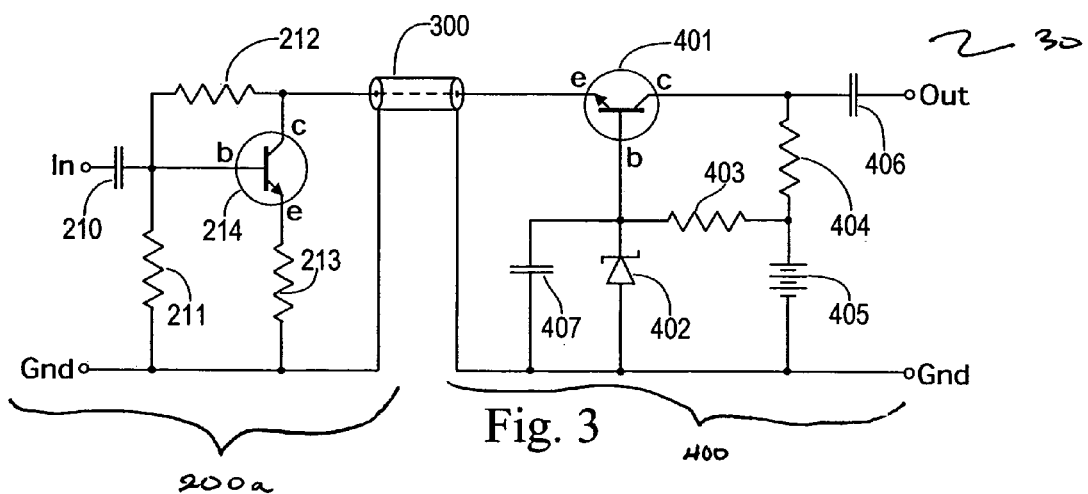
FIG. 3 is a schematic diagram of a split cascode line amplifier in accordance with an alternative embodiment of the present invention.

FIG. 3 is a schematic diagram of a split cascode line amplifier 30 in accordance with an alternative embodiment of the invention. Here, front end 200a is implemented using a bipolar transistor instead of a junction field effect transistor. The remaining components of the split cascode line amplifier circuit in the present embodiment are identical to the respective components of the circuit shown in FIG. 2. The advantages associated with substituting a bipolar transistor for a JFET is that bipolar transistors are somewhat cheaper than JFETs, have greater gain, and require less current to operate. The disadvantage of using the bipolar transistor is that the input impedance of the front end 200a is reduced from megohms to kilohms. However, if the impedance of the signal source 100 is low enough, the lowered input impedance of the front end becomes insignificant.

With reference to FIG. 3, the front end 200a of the alternative embodiment includes input DC blocking capacitor 210, bipolar transistor 214, bias resistors 211 and 212, and emitter resistor 213. Bipolar transistors inherently perform voltage-to-current conversion in the circuit configuration of the present embodiment (i.e., common emitter, inverting amplifier) and typically have output (i.e., collector) impedances in the order of megohms. As a result, the transistor 214 performs the desired voltage-to-current conversions. As is well known in the art, bias resistors 211 and 212, and emitter resistor 213, operate in unison to set the operating point of the bipolar transistor 214.

Typically, the actual voltage-in to current-out transfer function of the bipolar transistor 214 is non-linear, where the collector current varies exponentially with the base-emitter voltage. This is a high level of non-linearity, and in accordance with the present embodiment, its effect is reduced by providing a resistor between the emitter of the transistor 214 and ground. Here, resistor 213 is used to reduce the effects associated with the non-linearity of the voltage-in to current-out transfer function of bipolar transistor 214.

With further reference to FIG. 3, the collector current causes a voltage drop in resistor 213. The total input voltage supplied to the amplifier 30 from point "In" is the base-emitter voltage (e.g., 0.55 to ~0.65 volts) plus the voltage drop in the resistor 213, e.g., 1-2 volts. In operation, transistor 214 adjusts its collector current such that the voltage drop across resistor 213 plus the base-emitter voltage is substantially equal to the input voltage. This automatic self-adjustment is a form of negative feedback. Hence, unbypassed emitter resister 213 provides a substantial level of negative feedback to linearize the transfer function of transistor 214, and to stabilize the collector current operating point due to variations in operating parameters of the transistor, such as those due to its temperature and collector voltage. As a result, the non-linearity of the transfer function of transistor 214 is minimized, but at the expense of voltage gain. Typical component values are 2N3904 for transistor 214, 10 kilohms for upper bias resistor 212, 33 kilohms for lower bias resistor 211, 1 kilohm for emitter resistor 213, and 4.7 microfarads for DC blocking capacitor 210.

It is readily understood by persons skilled in the art that the voltage-to-current conversion gain may be increased by bypassing the emitter resistor 213, either partially or completely. It is also understood that this increase in gain may necessitate splitting bias resistor 212 into two smaller resistors that are connected in series with each other, and bypassing the center of the two resistors to ground. (The split resistor and bypass capacitor are not shown.)

It will also be understood by those skilled in the art that transistor 214 can also be used to convert a small current input into a larger current-mode signal which is suitable for transmission along transmission cable 300. In this case, the transmission cable 300 and back end 400 of the alternative embodiment are identical to that of the transmission cable and back end of the preferred embodiment. In addition, the operation of the alternative embodiment of the split line cascode amplifier is substantially identical to the operation of the split cascode line amplifier described with respect to the preferred embodiment. However, the operating-point currents and voltages of the split cascode line amplifier described with respect to the alternative embodiment differ from the operating-point currents described in the line amplifier of the preferred embodiment.

In an additional embodiment, an electret microphone having a built-in amplifier includes both signal source 100 (i.e., the electret element) and a front end 200, such as a JFET, an IC, or the like. In accordance with the present embodiment, the built-in JFET or integrated amplifier in the microphone is used as the first amplifying device of the split cascode line amplifier as described in the exemplary embodiments. Such a configuration is feasible, since electret microphones with a built-in amplifier may be considered to include both the signal source 100 (the electret element) and the front end 200 (typically a JFET or an IC). This holds true even though the built-in amplifier generates an output voltage, instead of an output current. This is due to the output impedance of the built-in amplifier being in the range of hundreds to thousands of ohms. This is a factor of ten times larger than the 20 ohm impedance of the back end 400 of the contemplated embodiments.

In the circuit of the contemplated embodiments, the typical values of the components may vary, since electret microphones are components manufactured worldwide by multiple entities and sold in large quantities. However, in accordance with the present embodiment, the built-in JFETs electrically respond similarly to a 2N4338 JFET. An example of an integrated circuit amplifier specifically designed for use in electret microphones is a LMV1014, manufactured by National Semiconductor.

In operation, the split cascode line amplifier of the present embodiment operates substantially identically to the operation of the split cascode line amplifier of the preferred embodiment. However, the operating-point currents and voltages of the split cascode line amplifier of the present embodiment differ somewhat from the operating-point currents and voltages of the split cascode line amplifier described with respect to the preferred embodiment.

Figure 4:
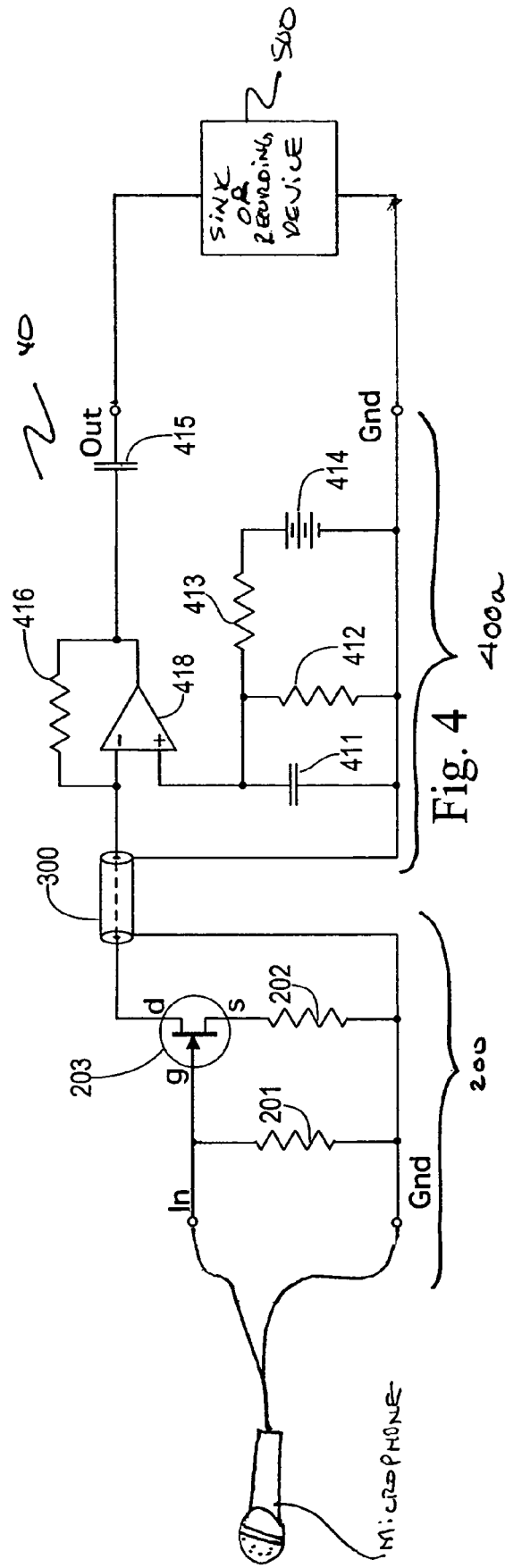
FIG. 4 is a schematic diagram of a split cascode line amplifier in accordance with another embodiment of the present invention.

FIG. 4 is a schematic diagram of a split cascode line amplifier 40 in accordance with another embodiment of the present invention. Here, front end 200 and transmission cable 300 are identical to the respective components of the circuit shown in FIG. 2. In accordance with the present embodiment, the back end 400a is implemented using a conventional operational amplifier 418, such as an OP113 manufactured by Analog Devices.

With reference to FIG. 4, the inverting input of operational amplifier 418 is indicated by a minus sign (−), while the non-inverting input is indicated by a plus sign (+). The use of an operational amplifier advantageously provides greater flexibility, permit the selection of a wider variety of components that can be used, along with providing the excellent performance characteristics associated with operational amplifiers which are widely available.

The back end 400a of the present embodiment comprises bypass capacitor 411, voltage divider resistors 412 and 413, feedback resistor 416, coupling capacitor 415, power source 414, and operational amplifier 418. For visual clarity, the connection of the operation amplifier to the power source 414 is not shown. However, in accordance with the present embodiment, operational amplifier 418 may be connected to and thus, powered by the power source 414, in a manner which is well understood by a person skilled in the art. Together, operational amplifier 418 and feedback resistor 416 function as a current-to-voltage converter, e.g., a trans-impedance amplifier, and convert the varying current from the front end 200 and transmission cable 300 into a varying voltage which is coupled to the output terminal by DC-blocking capacitor 415.

Voltage divider resistors 412 and 413 reduce the voltage of power source 414 to a predetermined voltage level which is supplied to the non-inverting (+) input of the operational amplifier 416. Along with resistors 412 and 413, bypass capacitor 411 "low-pass" filters any noise that is generated by the power source 414. As a result, the output signal of the back end 400a is protected from any noise that may be generated by the power source 414.

It is known that operational amplifiers maintain the difference between the voltage at their inverting (−) and non-inverting (+) inputs at an extremely small level. In fact, this difference is effectively zero. In accordance with the present embodiment of the invention, the non-inverting input terminal of operational amplifier 418 is maintained at the predetermined voltage level by voltage divider resistors 412 and 413. In the preferred embodiment, the predetermined voltage level is 3.0 volts. In the absence of a signal from signal source 100, the front end 200 draws a constant current of approximately 1.7 milliamps. As a result, the output of the operational amplifier 418 is set to a constant voltage potential. In the preferred embodiment, the constant voltage potential is 3.0+(0.0017)×(1800) =6.06 volts. The operational amplifier generates an output voltage which permits the setting of its inverting input to 3.0 volts, while supplying 1.7 milliamps to the front end 200.

In accordance with the present embodiment, if the current drawn by the front end 200 varies when responding to a signal, the output of the operational amplifier 418 will also vary. Specifically, if the current drawn by the front end 200 rises, then the output voltage of operational amplifier 418 will also rise to permit passage of the required current through the feedback resistor 416. Similarly, if the current is reduced, then a lower voltage level is needed from operational amplifier 418 to provide the reduced current. Typical component values for the back end 400a of the present embodiment are 100 kilohms and 200 kilohms for voltage divider resistors 412 and 413 respectively, 1.8 kilohms for feedback resistor 416, 9.0 volts for power source 414, and 4.7 microfarads for both bypass capacitor 411 and coupling capacitor 415.

The present invention provides an effective and economical way to reduce or eliminate the negative effects associated with source loading, cable microphonics, cable capacitance, and dielectric absorption in the cable insulation. As a result, it becomes possible to choose low cost audio cables having improved mechanical properties without sacrificing the quality of signals that are transmitted over vast distances.

Although the invention has been described and illustrated in detail, it is to be clearly understood that the same is by way of illustration and example, and is not to be taken by way of limitation. Examples of circuits implemented in one embodiment may be substituted for similar circuits in other embodiments. The spirit and scope of the present invention are to be limited only by the terms of the appended claims.

What is claimed is:

1. A low frequency signal transmission system, comprising a split cascode amplifier:
   a front end common emitter or source amplifier portion of said split cascode amplifier which receives a low frequency voltage signal, said front end amplifier converting the voltage signal into a current signal at its output and having a high output impedance;
   a two conductor transmission line in which the conductors are in close proximity to each other, one end of said line receiving the current signal from the front end amplifier and delivering it to a second end at a remote location;
   a back end common base or gate buffer circuit portion of said split cascode amplifier, which receives the current signal from the second end of said transmission line and converts it into an output voltage, said back end buffer circuit having an input impedance which is significantly lower than the output impedance of the front end amplifier;
   wherein the front end amplifier includes a junction field effect transistor, a pate resistor, and a source resistor;
   wherein the gate resistor and source resistor operate in unison to set an operating point of the junction field effect transistor, and the source resistor provides a substantial level of negative feedback; and
   wherein the level of negative feedback stabilizes a drain current operating point of the junction field effect transistor due to variations in operating parameters of the transistor.

2. The low frequency signal transmission system of claim 1, wherein the back end buffer circuit is biased so that it produces a direct current voltage at its input, and the direct current voltage is transmitted through the transmission line and powers the front end amplifier, said voltage being established by a zener diode.

3. The low frequency signal transmission system of claim 1, further including a transducer for generating the low frequency voltage signal.

4. The low frequency signal transmission system of claim 3, wherein the transducer converts musical sounds into voltage signals.

5. The low frequency signal transmission system of claim 1, further including a signal sink for receiving the voltage output of the buffer.

6. The low frequency signal transmission system of claim 5, wherein the signal sink is a digitizer.

7. The low frequency transmission system of claim 3, wherein the transducer is one of a microphone, an electromagnetic or piezoelectric transducer, a low-frequency antenna, and an accelerometer.

8. The low frequency transmission system of claim 3, wherein the transducer is connected to a musical instruments and converts musical sounds into voltage signals.

9. The low frequency transmission system of claim 7, wherein the transducer is connected to a musical instruments and converts musical sounds into voltage signals.

10. The low frequency transmission system of claim 1, wherein the transmission line is one of a coaxial cable, a twisted pair cable, a star-quad cable, and zipcord.

11. The low frequency transmission system of claim 1, wherein the front end amplifier is phantom powered by the back end buffer circuit via the transmission line.

12. The low frequency transmission system of claim 1, wherein the front end amplifier is one of a field effect or bipolar transistor, a vacuum tube, and an integrated circuit.

13. The low frequency transmission system of claim 1, wherein the front end amplifier is an integrated circuit operational amplifier.

14. The low frequency transmission system of claim 1, wherein the system is an electret microphone having a built-in amplifying device.

15. The low frequency transmission system of claim 1, wherein the back end buffer circuit includes an operational amplifier which is set to a constant voltage potential.

16. The low frequency transmission system of claim 5, wherein the signal sink is one of an amplifier, and a recording device.

17. The low frequency transmission system of claim 1, wherein a varying voltage waveform applied to an input of the front end amplifier is propagated as a substantially constant voltage but varying current over the transmission line.

18. The low frequency transmission system of claim 17, wherein the varying current is converted back to a varying voltage by the back end buffer circuit, and is supplied to a signal sink as a varying voltage waveform that replicates a shape of the voltage waveform applied to the input of the front end amplifier.

19. The low frequency transmission system of claim 1, wherein the junction field effect transistor performs voltage-to-current conversions.

\* \* \* \* \*